United States Patent
Kreiner et al.

(10) Patent No.: US 12,429,755 B2
(45) Date of Patent: Sep. 30, 2025

(54) RADIATION-EMITTING DEVICE, AND PROJECTOR EQUIPPED THEREWITH

(71) Applicant: ams-OSRAM International GmbH, Regensburg (DE)

(72) Inventors: Laura Kreiner, Regensburg (DE); Britta Goeoetz, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 403 days.

(21) Appl. No.: 17/917,924

(22) PCT Filed: Mar. 18, 2021

(86) PCT No.: PCT/EP2021/056952
§ 371 (c)(1),
(2) Date: Oct. 7, 2022

(87) PCT Pub. No.: WO2021/204511
PCT Pub. Date: Oct. 14, 2021

(65) Prior Publication Data
US 2023/0152678 A1    May 18, 2023

(30) Foreign Application Priority Data
Apr. 8, 2020   (DE) ............... 10 2020 204 540.2

(51) Int. Cl.
G03B 21/20    (2006.01)
G03B 33/12    (2006.01)

(52) U.S. Cl.
CPC ..... *G03B 21/2033* (2013.01); *G03B 21/2066* (2013.01); *G03B 33/12* (2013.01)

(58) Field of Classification Search
CPC ............ G03B 21/2033; G03B 21/2066; G03B 33/12; A61K 40/4238; H10H 29/8513;
(Continued)

(56) References Cited

U.S. PATENT DOCUMENTS

| | | | |
|---|---|---|---|
| 5,813,752 A | 9/1998 | Singer et al. | |
| 6,738,194 B1 * | 5/2004 | Ramirez | G02B 5/22 |
| | | | 359/485.02 |

(Continued)

FOREIGN PATENT DOCUMENTS

| | | |
|---|---|---|
| CN | 101960621 A | 1/2011 |
| CN | 104298060 A | 1/2015 |

(Continued)

OTHER PUBLICATIONS

International Search Report issued for corresponding International Patent Application No. PCT/EP2021/056952 mailed on Jun. 10, 2021, along with an English translation.

(Continued)

*Primary Examiner* — Magda Cruz
(74) *Attorney, Agent, or Firm* — HAUPTMAN HAM, LLP

(57) ABSTRACT

A radiation-emitting device includes an optoelectronic component for emitting first electromagnetic radiation. The radiation-emitting device also includes a conversion element having an entrance surface and an exit surface. The radiation-emitting device further includes a dielectric mirror on the exit surface. The radiation-emitting device is configured such that first radiation emitted by the component during operation enters the conversion element via the entrance surface. The conversion element is configured for converting the first radiation into second electromagnetic radiation, which subsequently exits the conversion element via the exit surface. The dielectric mirror is transmissive to second radiation that is incident at angles of incidence in a predefined first angle range, and is reflective for second radiation that is incident at angles of incidence in a predefined second angle range.

13 Claims, 7 Drawing Sheets

Figure 1:
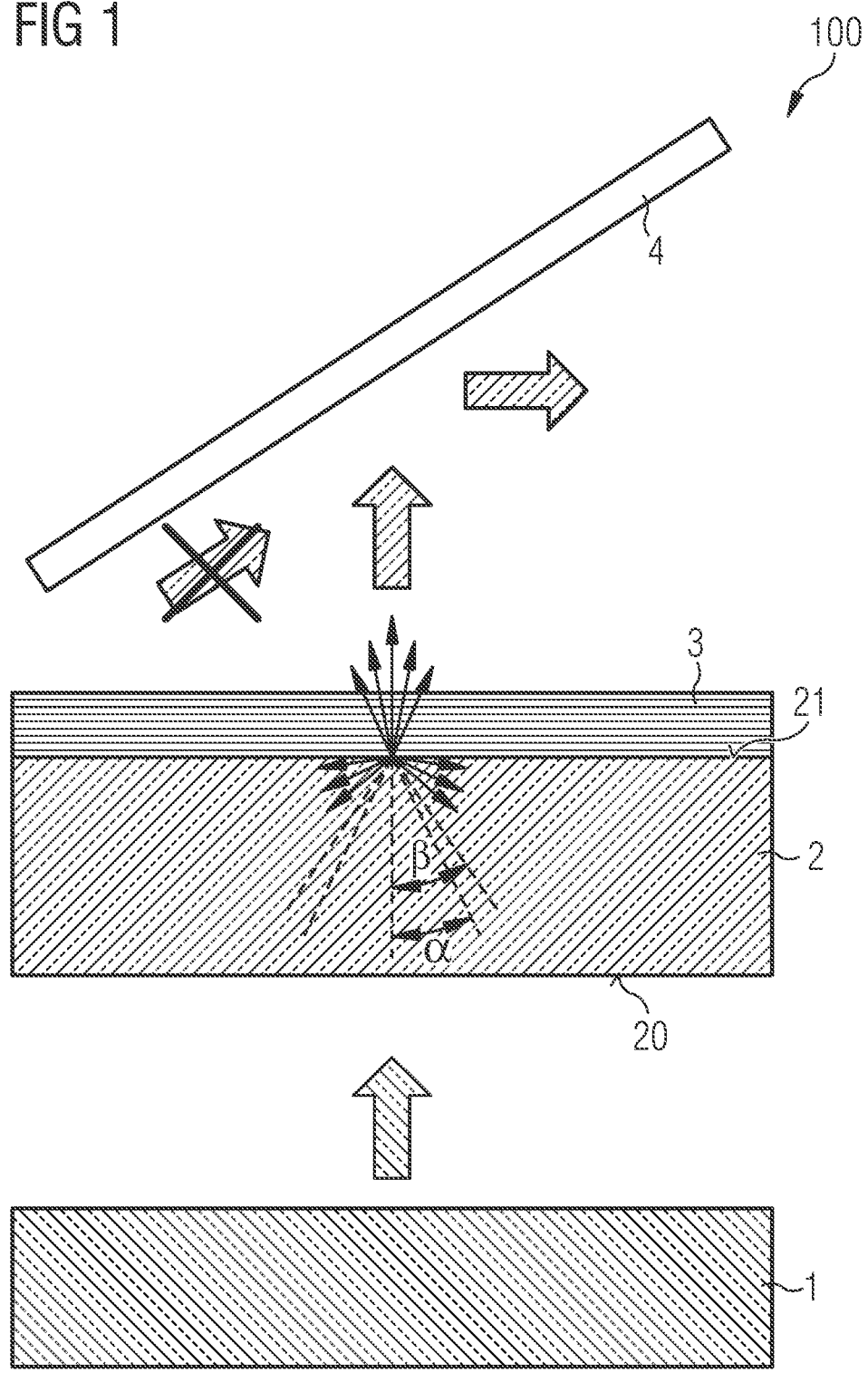

(58) Field of Classification Search
CPC . H10H 29/41; H10D 84/8316; H10D 86/0227
USPC .......................................................... 353/82
See application file for complete search history.

(56) References Cited

U.S. PATENT DOCUMENTS

| | | |
|---|---|---|
| 2004/0264185 A1* | 12/2004 | Grotsch ............... H04N 9/3164 |
| | | 257/E33.071 |
| 2008/0158873 A1 | 7/2008 | Bierhuizen et al. |
| 2010/0277887 A1 | 11/2010 | Su et al. |
| 2011/0182317 A1* | 7/2011 | Brick ........................ H01S 5/14 |
| | | 372/50.124 |
| 2018/0287018 A1* | 10/2018 | Goldbach .......... H10H 20/8512 |

FOREIGN PATENT DOCUMENTS

| | | | | |
|---|---|---|---|---|
| DE | 10 2007 057 669 A1 | 6/2009 | | |
| WO | WO-2005049840 A2 * | 6/2005 | ............. | G01B 11/25 |
| WO | 2006/035388 A2 | 4/2006 | | |
| WO | 2009/107056 A2 | 9/2009 | | |

OTHER PUBLICATIONS

Written Opinion issued for corresponding International Patent Application No. PCT/EP2021/056952 mailed on Jun. 10, 2021.

* cited by examiner

RADIATION-EMITTING DEVICE, AND PROJECTOR EQUIPPED THEREWITH

CROSS REFERENCE TO RELATED APPLICATION

This application is a National Stage of International Application No. PCT/EP2021/056952, filed on Mar. 18, 2021, which designates the United States and was published in Europe, and which claims priority to German Patent Application No. 10 2020 204 540.2, filed on Apr. 8, 2020, in the German Patent Office. Both of the aforementioned applications are hereby incorporated by reference in their entireties.

A radiation-emitting device is specified. Furthermore, a projector is specified.

One object to be achieved consists in specifying a radiation-emitting device having a high luminance. A further object to be achieved consists in specifying a projector comprising such a radiation-emitting device.

These objects are achieved, inter alia, by means of the subjects of independent patent claim 1 and of patent claim 13. Advantageous configurations and developments are the subject of the further dependent patent claims and are furthermore evident from the following description and the drawings.

In accordance with at least one embodiment, the radiation-emitting device comprises an optoelectronic component for emitting first electromagnetic radiation. For this purpose, the component comprises in particular a semiconductor body having an active region. The first radiation is primary radiation generated in the active region and/or secondary radiation generated as a result of conversion of the primary radiation in the component.

The semiconductor body of the component is based for example on a III-V compound semiconductor material. The semiconductor material is for example a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, where in each case $0 \le n \le 1$, $0 \le m \le 1$ and $m+n \le 1$. The semiconductor body here can have dopants and additional constituents. For the sake of simplicity, however, only the essential constituents of the crystal lattice of the semiconductor body, i.e. Al, As, Ga, In, N or P, are specified, even if these can be replaced and/or supplemented in part by small amounts of further substances. Preferably, the semiconductor body is based on AlInGaN.

The active region of the semiconductor body includes in particular at least one pn junction and/or at least one quantum well structure in the form of a single quantum well, SQW for short, or in the form of a multi-quantum well structure, MQW for short. For example, during operation as intended, the active region generates electromagnetic primary radiation in the blue or green or red spectral range or in the UV range or in the IR range.

The optoelectronic component is for example a semiconductor chip or a so-called chip size package component. Both in the case of a semiconductor chip and in the case of a chip size package component, its lateral dimensions, measured parallel to a main extension plane of the semiconductor body, substantially correspond to the lateral dimensions of the semiconductor body. In particular, the lateral dimensions of the component are then larger than those of the semiconductor body by at most 20% or at most 10% or at most 5%. Side surfaces of the component running transversely with respect to the main extension plane may have traces of a singulation process that result from singulation from a wafer assemblage. In the case of a chip size package component, the side surfaces are composed of a potting material, such as epoxy.

The first radiation generated and emitted by the component during operation is in particular incoherent radiation. The component is in particular a light-emitting diode (LED) or a light-emitting diode chip (LED chip).

The component can be free of the growth substrate on which the semiconductor body is grown. The component is then in particular a thin-film chip or a component comprising a thin-film chip.

The component can be pixelated, in such a way that the semiconductor body comprises a plurality of individually and independently controllable emission regions (pixels). By way of example, the semiconductor body is subdivided into at least four or at least ten or at least 50 emission regions.

In accordance with at least one embodiment, the radiation-emitting device comprises a conversion element having an entrance surface and an exit surface. The entrance surface and the exit surface are preferably situated opposite one another and run substantially parallel to one another. The conversion element can be embodied in particular in a laminar fashion, wherein the entrance surface and the exit surface then form the main sides of the lamina. A thickness of the conversion element, measured as distance between the entrance surface and the exit surface, is for example at least 10 μm and/or at most 1 mm.

The conversion element comprises or consists of one or more conversion materials. By way of example, the conversion element is a ceramic conversion element. Alternatively, however, the conversion element can also comprise a matrix material, for example composed of silicone or polysiloxane, in which particles composed of one or more conversion materials are distributed and embedded. The conversion material can be for example a garnet or a nitride or an oxide or an oxynitride.

In accordance with at least one embodiment, the radiation-emitting device comprises a dielectric mirror on the exit surface. The dielectric mirror is for example a periodic structure, that is to say a Bragg mirror, or a non-periodic structure.

The dielectric mirror can be arranged directly on the exit surface or can be secured indirectly on the exit surface. A distance between the dielectric mirror and the exit surface is preferably smaller than the thickness of the conversion element.

The dielectric mirror preferably comprises a plurality of, for example at least two or at least four or at least ten or at least 50 or at least 100, dielectric layers stacked one above another in relation to the exit surface. The dielectric layers of the dielectric mirror are for example alternately high refractive index and low refractive index layers. In this case, the refractive index of a high refractive index layer differs from that of a low refractive index layer by at least 0.1 or at least 0.3 or at least 0.5 or at least 1.0. By way of example, the low refractive index layers have a refractive index of at most 2. The high refractive index layers have for example a refractive index of at least 2.3. The values for the refractive index are specified here for the first radiation.

By way of example, the dielectric layers alternate in the dielectric mirror in such a way that there is one low refractive index layer between each two high refractive index layers, and vice versa. In the case of a periodic structure, the thicknesses of all the dielectric layers are identical within the scope of production tolerance. In the case of a non-periodic structure, the thicknesses of the dielectric layers vary.

The low refractive index layers comprise or consist of at least one of the following materials, for example: $SiO_2$, $SiN$, $SiON$, $MgF_2$. The high refractive index layers comprise or consist of at least one of the following materials, for example: $Nb_2O_5$, $TiO_2$, $ZrO_2$, $HfO_2$, $Al_2O_3$, $Ta_2O_5$, $ZnO$. The thicknesses of the dielectric layers are for example in each case between 10 nm and 300 nm inclusive.

From the standpoint of a plan view, the dielectric mirror covers the exit surface of the conversion element for the most part, for example to the extent of at least 80%, or completely.

In accordance with at least one embodiment, the device is configured such that first radiation emitted by the component during operation enters the conversion element via the entrance surface. By way of example, the device is configured such that a large portion, for example, at least 75% or at least 90%, of the first radiation emitted by the component impinges on the entrance surface. Via the entrance surface, the first radiation then passes into the interior of the conversion element.

In accordance with at least one embodiment, the conversion element is configured for converting the first radiation into second electromagnetic radiation. The second radiation subsequently exits the conversion element via the exit surface.

The second radiation is red shifted relative to the first radiation. By way of example, the wavelength at which the second radiation has a global intensity maximum is red shifted by at least 50 nm or at least 100 nm relative to the wavelength at which the first radiation has a global intensity maximum. The second radiation is preferably likewise radiation in the visible spectral range. By way of example, the first radiation is blue light and the second radiation is green light.

The conversion element can be configured for partly or completely converting the first radiation that has entered. After the conversion, at least a large portion, for example at least 75% or at least 90%, of the second radiation generated exits the conversion element via the exit surface.

In accordance with at least one embodiment, the dielectric mirror is transmissive to second radiation that impinges on the dielectric mirror at angles of incidence in a predefined first angle range, and is reflective for second radiation that impinges on the dielectric mirror at angles of incidence in a predefined second angle range. The dielectric mirror can be reflective or transmissive for the first radiation at all angles of incidence. The first angle range and the second angle range preferably do not overlap.

Angles of incidence are measured here as angles with respect to a normal to the dielectric mirror. A normal to a dielectric mirror should be understood to mean a normal to the main extension plane of the dielectric mirror.

Here and hereinafter, "transmissive" is understood to mean that an element transmits or passes at least 75%, preferably at least 90%, particularly preferably at least 99%, of radiation. "Reflective" is understood to mean that an element reflects more than 75%, preferably at least 90%, particularly preferably at least 99%, of radiation.

The terms "predefined first angle range" and "predefined second angle range" relate to the fact that in the design of a dielectric mirror, the angle range in which said dielectric mirror is transmissive and the angle range in which said dielectric mirror is reflective can be set precisely and as desired by selection of the materials of the dielectric layers and the thickness of the dielectric layers. In this respect, the angle ranges transmission and reflection can be predefined or chosen or determined.

Since a dielectric mirror is usually optimized for radiation of one wavelength or of a narrow range around this wavelength, indications given here and hereinafter regarding the reflection and the transmission of a mirror for radiation relate in particular to that wavelength at which the radiation has a global intensity maximum.

In at least one embodiment of the radiation-emitting device, the latter comprises an optoelectronic component for emitting first electromagnetic radiation, a conversion element having an entrance surface and an exit surface, and a dielectric mirror on the exit surface. The device is configured such that first radiation emitted by the component during operation enters the conversion element via the entrance surface. The conversion element is configured for converting the first radiation into second electromagnetic radiation, which subsequently exits the conversion element via the exit surface. The dielectric mirror is transmissive to second radiation that is incident at angles of incidence in a predefined first angle range, and i reflective for second radiation that is incident at angles of incidence in a predefined second angle range.

The present invention is based on the insight, inter alia, that, for projection applications, the highest possible luminance is required in the application. In this case, it is possible only to use radiation in a delimited angular cone defined primarily by way of the optical system downstream of the conversion element. A radiation source with as far as possible a narrow-angle emission characteristic, such as realized by the present combination of component, conversion element and dielectric mirror, can supply a higher luminance in the application. Since, in this case, little radiation is moreover emitted at solid angles which cannot be used in the application or even disturb it, a better imaging quality with less scattered light can be achieved. As a result, the device overall and in particular the optical system disposed downstream of the conversion element are heated to a lesser extent by the absorption of radiation that cannot be used in the application.

In particular for projection solutions with LEDs, green light is typically generated for fully converting blue light in a conversion element. Improvements in the emission characteristic which are attained upstream of the conversion element, for example at the component level, therefore cannot be fully exploited for green light. The present invention improves the emission characteristic downstream of the radiation conversion, as a result of which the device is suitable in particular for the generation of green light in projection applications.

In accordance with at least one embodiment, the first angle range comprises all angles of incidence of between 0° and a inclusive, measured with respect to a normal to the dielectric mirror. The first angle range thus forms a cone with the normal as axis of rotation and an opening angle of $2 \cdot \alpha$. $\alpha$ has for example a value of at most 75° or at most 60° or at most 45° or at most 30° or at most 20° or at most 10°. Alternatively or additionally, the value for $\alpha$ is for example at least 5° or at least 10°.

In accordance with at least one embodiment, the second angle range comprises all angles of incidence of at least $\beta$, measured with respect to the normal to the dielectric mirror where $\beta \geq \alpha$ holds true. Preferably, $\beta$ is at least 1° or at least 5° or at least 10° greater than $\alpha$. Alternatively or additionally, $\beta$ is at most 10° or at most 5° greater than $\alpha$. Preferably, the second angle range comprises all angles of incidence of between $\beta$ and 90° inclusive.

In accordance with at least one embodiment, the dielectric mirror has a transmittance of at least 75% or at least 90% or least 99% at for second radiation incident at angles of incidence in the first angle range, and a reflectance of at least 75% or at least 90% or at least 99% for second radiation incident at angles of incidence in the second angle range. The specified values of the transmittance and of the reflectance for the second radiation particularly preferably hold true for all angles of incidence in the respective angle range.

In accordance with at least one embodiment, the conversion element is configured for fully converting the first radiation into the second radiation. In particular, then at least 95% or at least 99% of the radiation that exits the conversion element via the exit surface during operation of the device as intended is second radiation, and at most 5% or at most 1% is first radiation.

In accordance with at least one embodiment, the radiation-emitting device further comprises an optical element disposed downstream of the conversion element and the dielectric mirror and configured for deflecting the second radiation. The optical element can be a lens or a lens system or a prism or a prism system or a beam splitter or a (semi-transmissive) mirror or a combination of two or more of these elements. In particular, the optical element is configured to direct the second radiation that exits the conversion element via the exit surface and passes through the dielectric mirror onto a projection surface, for example onto a projection screen.

In accordance with at least one embodiment, the conversion element has scattering centers for redistributing the radiation reflected back from the dielectric mirror into the conversion element.

The scattering centers can be scattering particles that are distributed in the conversion element. By way of example, the scattering particles are particles composed of an oxide or a nitride or a phosphide, for example composed of $TiO_2$ or SiN or $Al_2O_3$. Alternatively or additionally, scattering centers can be realized by zone boundaries in the conversion element. These can be produced in a targeted manner by impurity phases or pores during the sintering of the conversion element. This is achieved for example by means of variants in the slip mixture and by means of selected process control.

As an alternative or in addition to scattering centers in the interior of the conversion element, however, the exit surface and/or the entrance surface of the conversion element can also be structured. An average roughness of the entrance surface and/or exit surface is then for example at least 200 nm or at least 500 nm or at least 1000 nm. A respective planarization layer can be applied to the structured exit surface and/or entrance surface, said planarization layer being planar and/or smooth on a side facing away from the conversion element. In this case, the planarization layer can be applied directly to the exit surface and/or entrance surface. The planarization layer preferably comprises a material that is transparent to the first and/or second radiation, such as silicon dioxide ($SiO_2$), for example. The planarization layer simplifies and improves the applying of dielectric mirrors.

In accordance with at least one embodiment, a second mirror is arranged on the entrance surface of the conversion element. The second mirror can be arranged directly on the entrance surface or can be secured indirectly on the entrance surface. For example, a distance between the second mirror and the entrance surface is at most the thickness of the conversion element. The second mirror is arranged in particular such that the first radiation from the component traverses the second mirror before it passes into the conversion element.

The second mirror can be a dielectric mirror and can then have a plurality of dielectric layers, like the dielectric mirror described above. All features disclosed in association with the dielectric mirror as regards the construction thereof are also disclosed for the second mirror. From the standpoint of a plan view of the entrance surface, the second mirror preferably covers a large portion, for example at least 80%, of the entrance surface, or the entire entrance surface. The above-described dielectric mirror on the exit surface may also be referred to hereinafter as first dielectric mirror.

In accordance with at least one embodiment, the second mirror is reflective for the second radiation and transmissive to the first radiation. This preferably holds true for all angles of incidence. This prevents second radiation generated in the conversion element from leaving the conversion element via the entrance surface. In accordance with at least one embodiment, a third mirror is arranged on the exit surface. The third mirror is preferably arranged between the (first) dielectric mirror and the exit surface. Alternatively, the third mirror can also be arranged on the side of the (first) dielectric mirror facing away from the conversion element.

The third mirror can be arranged directly on the exit surface or can be secured indirectly on the exit surface. From the standpoint of a plan view, the third mirror preferably covers a large portion of the exit surface, for example at least 80% of the exit surface, or the entire exit surface.

The third mirror can be a dielectric mirror and can then have a plurality of dielectric layers, like the dielectric mirror described above. All features disclosed in association with the dielectric mirror as regards the construction thereof are also disclosed for the third mirror.

In accordance with at least one embodiment, the third mirror is reflective for the first radiation. This preferably holds true for all angles of incidence. Such a third mirror prevents non-converted first radiation from leaving the conversion element via the exit surface. The third mirror is additionally transmissive to the second radiation, preferably for all angles of incidence or only for angles of incidence in the first angle range.

In accordance with at least one embodiment, the dielectric mirror is reflective for the first radiation. This then preferably holds true at all angles of incidence.

In accordance with at least one embodiment, the conversion element is arranged at a distance from the component. During operation of the device, the first radiation coming from the component then for example firstly traverses a distance through air or an optical waveguide before it impinges on the conversion element. In other words, the conversion element is a so-called remote conversion element.

In accordance with at least one embodiment, the conversion element is arranged indirectly or directly on the component. For example, from the standpoint of a plan view, the conversion element covers a large portion, for example at least 80% or 100%, of an emission surface of the component, via which a large portion of the first radiation is coupled out from the component during operation. A distance between the conversion element and the semiconductor body of the component is then for example at most of the same magnitude as the thickness of the conversion element.

In accordance with at least one embodiment, the radiation-emitting device comprises a second optoelectronic component for emitting third electromagnetic radiation. Like the component described above, hereinafter also referred to in some instances as first component, the second component can be a semiconductor chip, in particular an LED chip, or a chip size package component, for example a light-emitting diode. In particular, the second component, too, comprises a semiconductor body having an active region, in which primary is radiation generated during operation, which, possibly after conversion in the component, then forms the third radiation. All features disclosed in association with the optoelectronic component are also disclosed for the second optoelectronic component.

The third radiation emitted by the second component can for the most part overlap the first radiation or be substantially identical to the first radiation. In particular, the third radiation is preferably light of the same color as in the case of the first radiation. The semiconductor body of the second component can be based on the same material system as, and/or constructed substantially identically to, the semiconductor body of the first component. Preferably, the first component and the second component each emit blue light.

In accordance with at least one embodiment, the device is configured such that third radiation emitted by the second component during operation penetrates into the conversion element via the exit surface of the conversion element. That is to say that the conversion element is illuminated on both sides.

In accordance with at least one embodiment, the conversion element is configured for converting the third radiation. Preferably, the third radiation is converted into the second radiation. The conversion element can be configured for fully converting the third radiation. Overall, in this way, the luminance can be improved and more second radiation can be generated.

In accordance with at least one embodiment, the dielectric mirror is transmissive to the third radiation. Preferably, the dielectric mirror is transmissive to the third radiation at all angles of incidence. In particular, in that case, no elements that are reflective for the third radiation are arranged on the exit surface, and so the third radiation can penetrate into the conversion element in a manner obstructed as little as possible.

In accordance with at least one embodiment, an antireflection coating for the third radiation is applied on the exit surface. The antireflection coating is preferably configured such that at most 10% or at most 5% of the third radiation is reflected by the antireflection coating and at least 90% or at least 95% passes through the antireflection coating.

Furthermore, a projector is specified. The projector comprises in particular a radiation-emitting device described here. Preferably, the radiation-emitting device is then configured such that it emits green light. That is to say that the second radiation is preferably green light.

The projector can furthermore comprise one or more optoelectronic components which generate further colors, for example red light and blue light, during operation. In particular, the projector additionally comprises an optoelectronic component for generating red light and an optoelectronic component for generating blue light. These two optoelectronic components can generate the respective light intrinsically in the semiconductor body, without making use of conversion elements. The red and blue light from the two further optoelectronic components and the green light coming from the conversion element can be projected onto a projection surface, in particular a projection screen, via a common optical element or different optical elements. The optical element(s) comprise(s) for example image-generating elements, such as a so-called digital mirror device, DMD for short, and/or a lens system and/or a mirror system.

Further advantages and advantageous configurations and developments of the radiation-emitting device will become apparent from the following exemplary embodiments illustrated in association with the figures. Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size in order to enable better illustration and/or in order to afford a better understanding.

Figure 5:
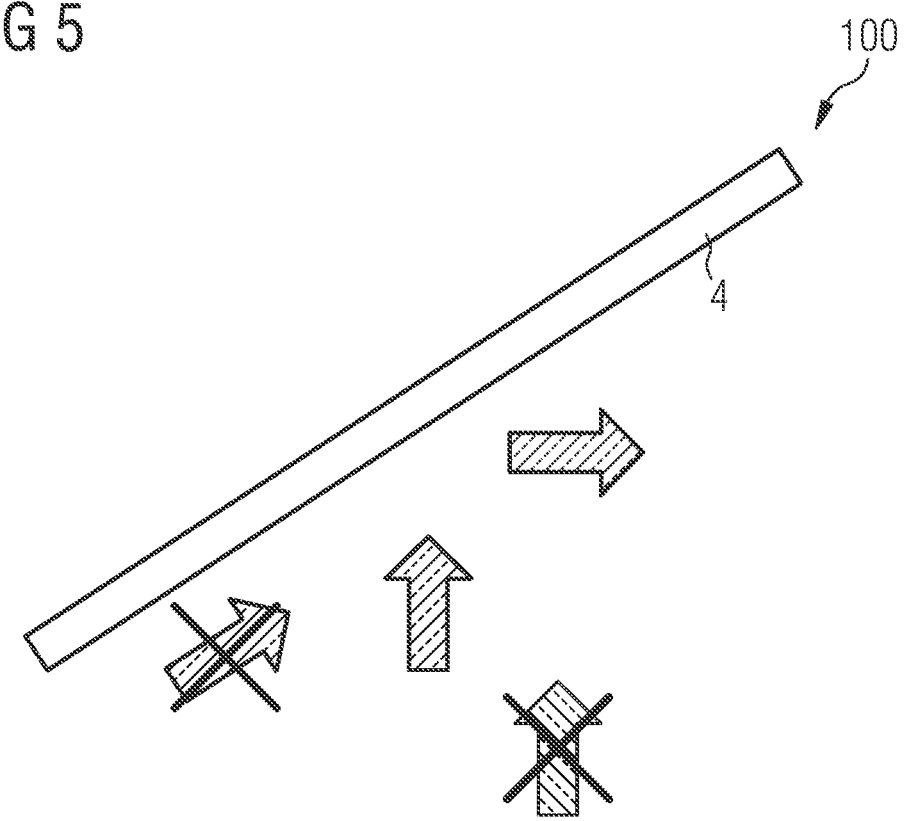
Figure 5:
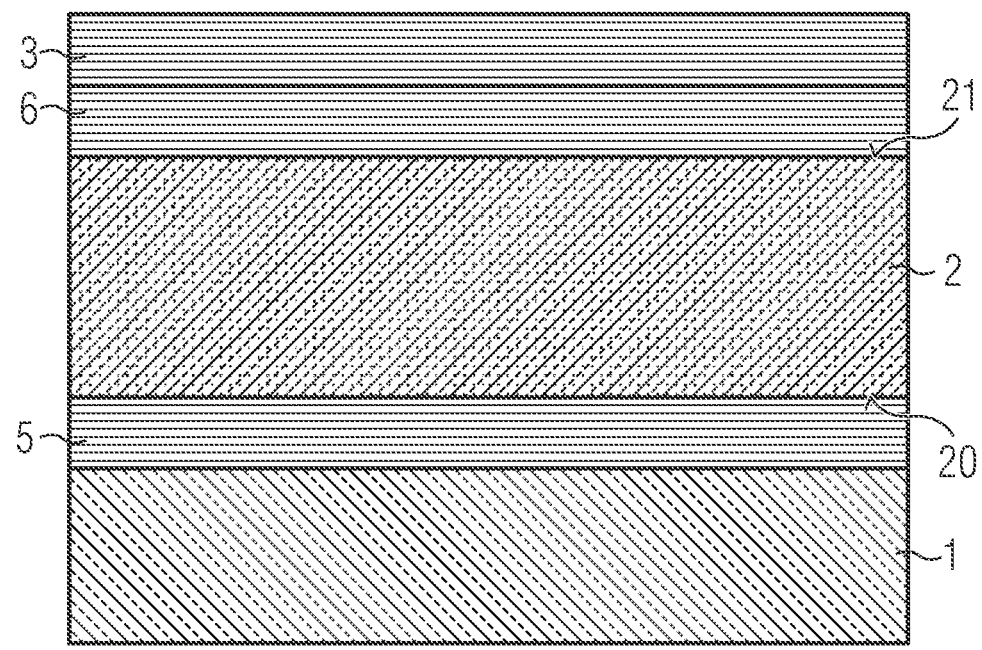
Figure 6:
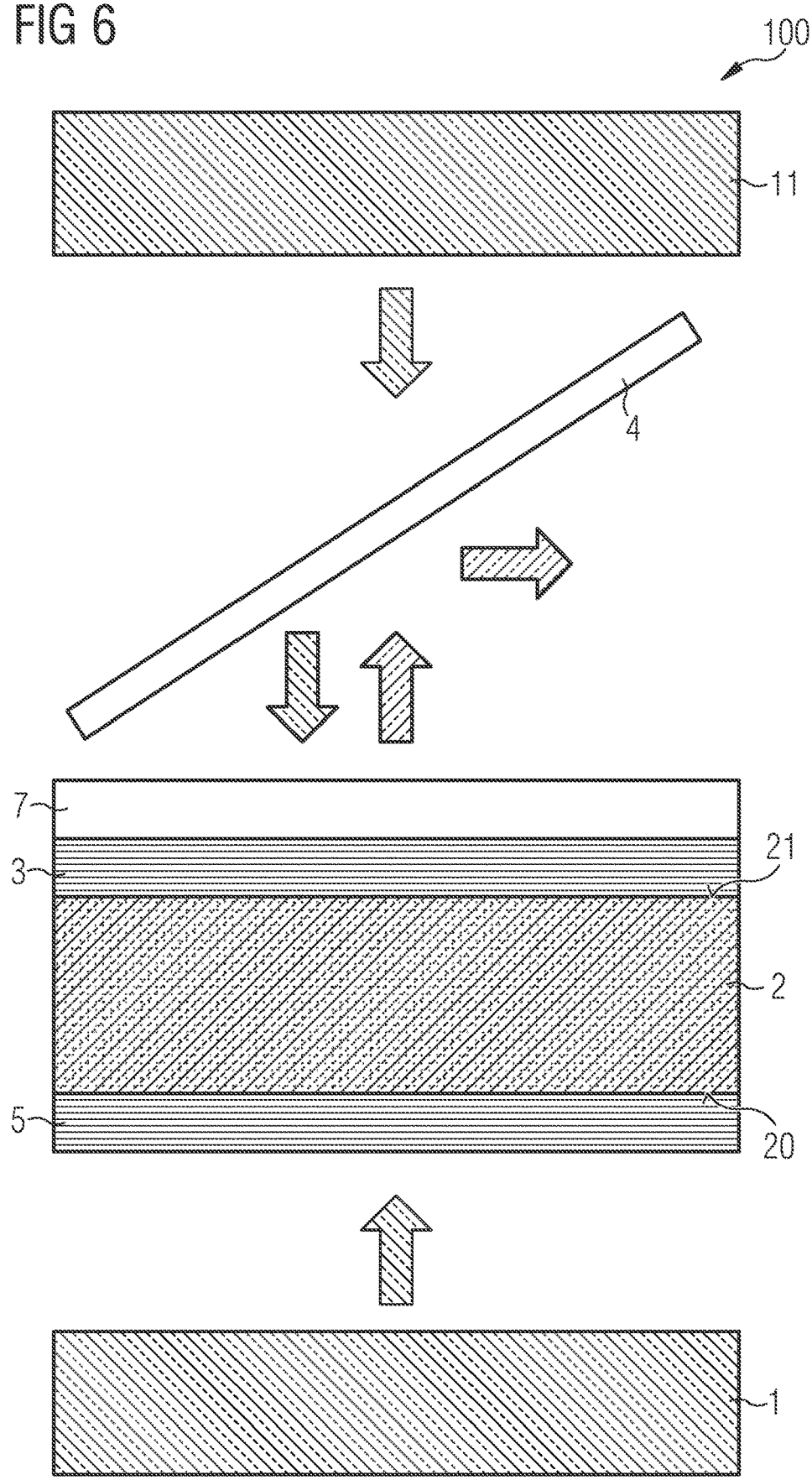
Figure 7:
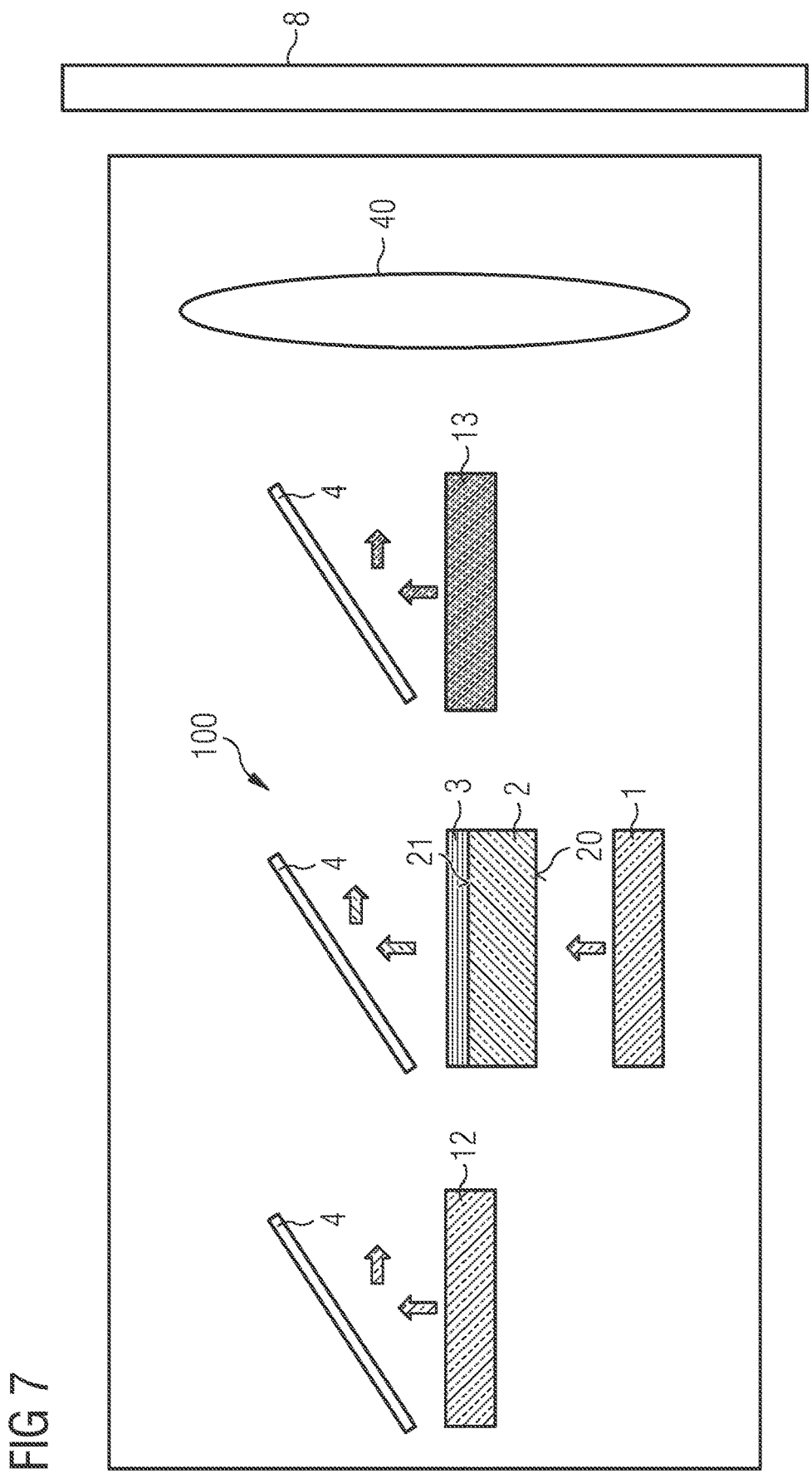

In the figures:

FIGS. 1 to 6 show various exemplary embodiments of the radiation-emitting device, and FIG. 7 shows one exemplary embodiment of a projector.

FIG. 1 shows a first exemplary embodiment of the radiation-emitting device 100. The device 100 comprises an optoelectronic component 1, in the present case a light-emitting diode (LED), which emits first radiation in the form of blue light during operation.

A laminar conversion element 2 comprising an entrance surface 20 and an exit surface 21 is disposed downstream of the component 1 in the beam direction. The conversion element 2 is for example a ceramic conversion element composed of sintered conversion material. The first radiation from the component 1 enters the conversion element 2 via the entrance surface 20 and is partly or completely converted into second radiation, for example green light, in said conversion element. The second radiation can then exit the conversion element 2 via the exit surface 21.

A dielectric mirror 3 comprising a plurality of dielectric layers having different refractive indices is arranged on the exit surface 21. The dielectric mirror 3 is configured such that it is transmissive to second radiation that is incident at angles of incidence in a first angle range of between 0° and a inclusive, and is reflective for second radiation that is incident at angles of incidence in a second angle range outside the first angle range (from β to 90°). In the present case, the value for α is 30°, for example. The value for β is 35°, for example. The dielectric mirror 3 can be reflective for the first radiation, independently of the angle of incidence.

An optical element 4 is disposed downstream of the conversion element 2 in the beam direction. In the present case, the optical element 4 is a mirror that deflects the radiation that has passed through the dielectric mirror 3. By way of example, the second radiation is directed onto a projection surface, such as a projection screen, for instance. The device 100 shown can be used in a projector. Through the angle-selective dielectric mirror 3, the second radiation (green light) is emitted in a small angle range, as a result of which the device 100 described is particularly well suited to projection applications.

Figure 2:
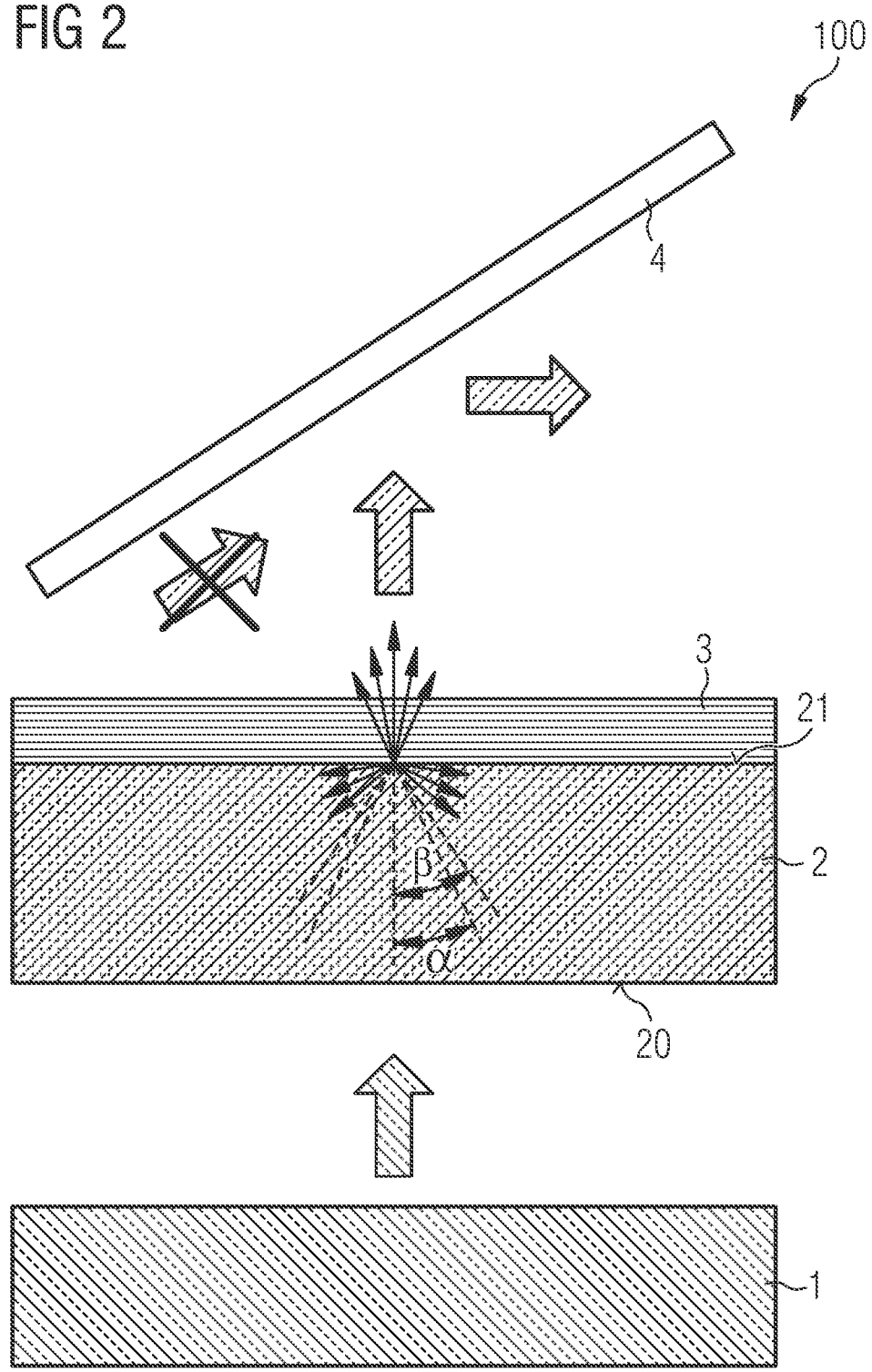

FIG. 2 shows a second exemplary embodiment of the radiation-emitting device 100. The latter differs from that from FIG. 1 in that the conversion element 2 comprises scattering centers in the form of scattering particles. These scatter and redistribute the radiation reflected back from the dielectric mirror 3, such that when it is next incident on the dielectric mirror 3, said radiation impinges on the dielectric mirror 3 in the first angle range, if appropriate. The scattering particles can be distributed uniformly in the conversion element 2. The scattering particles are for example scattering pores in a ceramic converter.

Instead of or in addition to scattering centers in the form of scattering particles within the conversion element, the entrance surface 20 and/or the exit surface 21 can also be structured, result of which a redistribution of the radiation reflected back is achieved.

Figure 3:
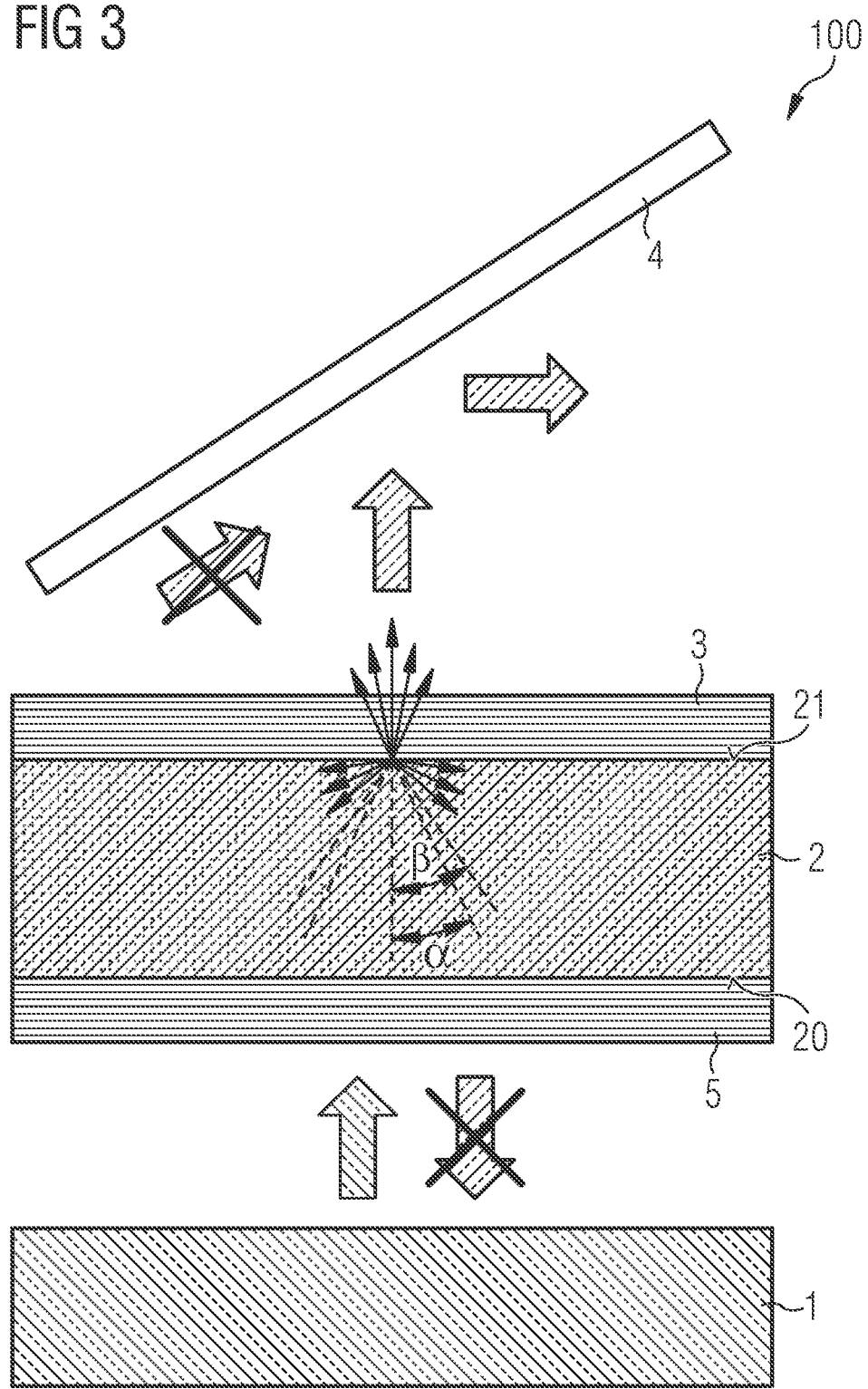

FIG. 3 shows a third exemplary embodiment of the radiation-emitting device 100. Here, in comparison with the exemplary embodiment in FIG. 2, a second dielectric mirror 5 is arranged on the entrance surface 20 of the conversion element 2. The second dielectric mirror 5, too, comprises a plurality of dielectric layers. The second dielectric mirror 5 is reflective for the second radiation and transmissive to the first radiation. This preferably applies to all angles of incidence. This prevents the second radiation from leaving the conversion element 2 again via the entrance surface 20.

Figure 4:
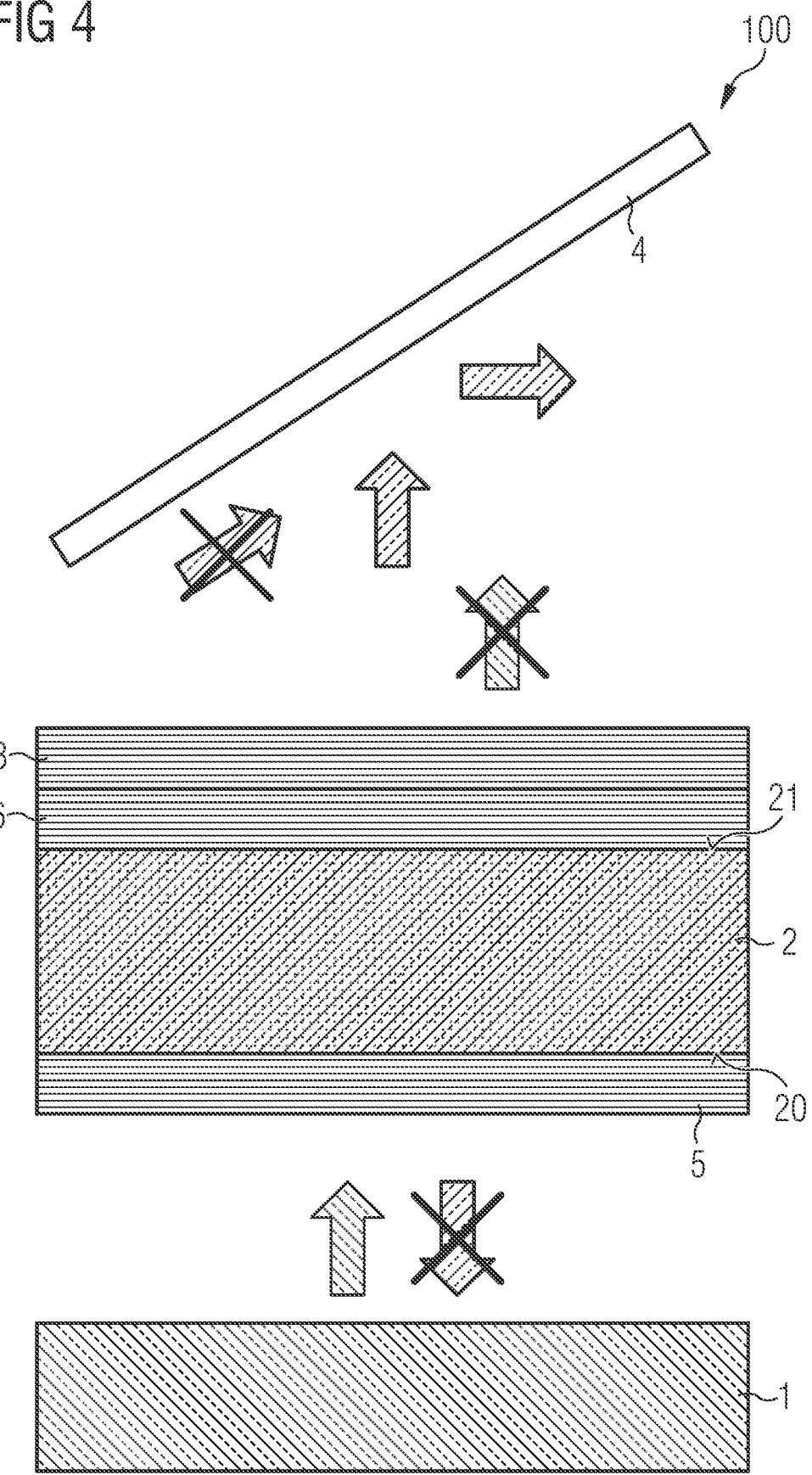

FIG. 4 shows a fourth exemplary embodiment of the radiation-emitting device 100. Here, in addition to the exemplary embodiment in FIG. 3, a third dielectric mirror 6 is arranged on the exit surface 21, between the dielectric mirror 3 and the exit surface 21. The third dielectric mirror 6 is reflective for the first radiation and transmissive to the second radiation, preferably independently of the angle of incidence. This prevents the first radiation from leaving the conversion element 2 via the exit surface 21.

Instead of a second 5 and third 6 dielectric mirror having a plurality of dielectric layers, it is also possible to use some other second mirror 5 and third mirror 6 having the desired properties. By way of example, such a second mirror 5 and such a third mirror 6 each comprise a plurality of dielectric layers.

FIG. 5 shows a fifth exemplary embodiment of the radiation-emitting device 100. Here, unlike in the preceding exemplary embodiments, the conversion element 2 is not arranged at a distance from the optoelectronic component 1. Rather, here the conversion element 2 is arranged and secured indirectly on the component 1.

FIG. 6 shows a sixth exemplary embodiment of the radiation-emitting device 100. Here, besides the first optoelectronic component 1, the device 100 comprises a second optoelectronic component 11, which emits third radiation. In the present case, the third radiation is likewise blue light. The device 100 is configured such that the third radiation emitted by the second component 11 penetrates into the conversion element 2 via the exit surface 21 of the conversion element 2. The third radiation previously passes through the optical element 4, which in the present case is formed by a semi-transmissive mirror. In order to be able to penetrate into the conversion element 2, in the present case the dielectric mirror 3 is transmissive to the third radiation, preferably at all angles of incidence.

In order to reduce reflection of the third radiation at the dielectric mirror 3, an antireflection coating 7 for the third radiation is applied on the side of the dielectric mirror 3 facing away from the conversion element 2.

FIG. 7 shows one exemplary embodiment of a projector comprising the radiation-emitting device 100 from FIG. 1. The radiation-emitting device 100 generates green light by means of conversion. Furthermore, the projector comprises a third optoelectronic component 12, in the present case in the form of a light-emitting diode, which generates intrinsically blue light, and a fourth optoelectronic component 13, likewise in the form of a light-emitting diode, which generates intrinsically red light. Each of the components 1, 12, 13 is assigned a mirror 4 for deflecting the respective light. The mirrors 4 are in particular each transmissive to the radiation from the preceding component. In this regard, for example, the mirror 4 assigned to the green-emitting component 1 is transmissive to blue light and reflective for green light. The mirror 4 assigned to the red-emitting component 13 is preferably transmissive to blue and green light and reflective for red light. The projector furthermore comprises a lens 40, with the aid of which the light is projected onto a projection screen 8.

The invention is not restricted to the exemplary embodiments by the description on the basis of said exemplary embodiments. Rather, the invention encompasses any novel feature and also any combination of features, which in particular includes any combination of features in the patent claims, even if these features or this combination itself are/is not explicitly specified in the patent claims or exemplary embodiments.

LIST OF REFERENCE SIGNS 1 (First) optoelectronic component
2 Conversion element
3 (First) dielectric mirror
4 Optical element
5 Second dielectric mirror
6 Third dielectric mirror
7 Antireflection coating
8 Projection screen
11 Second optoelectronic component
12 Third optoelectronic component
13 Fourth optoelectronic component
20 Entrance surface
21 Exit surface
40 Lens
100 Radiation-emitting device
α Angle
β Angle

The invention claimed is:
1. A radiation-emitting device, comprising
an optoelectronic component for emitting first electromagnetic radiation,
a conversion element having an entrance surface and an exit surface, and
a dielectric mirror on the exit surface, wherein
the radiation-emitting device is configured such that first radiation emitted by the component during operation enters the conversion element via the entrance surface,
the conversion element is configured for converting the first radiation into second electromagnetic radiation, which subsequently exits the conversion element via the exit surface,
the dielectric mirror is transmissive to second radiation that is incident at angles of incidence in a predefined first angle range, and is reflective for second radiation that is incident at angles of incidence in a predefined second angle range,
the first angle range comprises all angles of incidence of between 0° and α inclusive, measured with respect to a normal to the dielectric mirror, and
the second angle range comprises all angles of incidence of at least β, measured with respect to the normal to the dielectric mirror, where β≥α holds true.
2. The radiation-emitting device as claimed in claim 1, wherein
the conversion element is configured for fully converting the first radiation into the second radiation.

3. The radiation-emitting device as claimed in claim 1, further comprising
an optical element disposed downstream of the conversion element and the dielectric mirror and configured for deflecting the second radiation.

4. The radiation-emitting device as claimed in claim 1, wherein
the conversion element has scattering centers for redistributing the radiation reflected back from the dielectric mirror into the conversion element.

5. The radiation-emitting device as claimed in claim 1, wherein
a second mirror is arranged on the entrance surface of the conversion element,
the second mirror is reflective for the second radiation and transmissive to the first radiation.

6. The radiation-emitting device as claimed in claim 1, wherein
a third mirror is arranged on the exit surface,
the third mirror is reflective for the first radiation.

7. The radiation-emitting device as claimed in claim 1, wherein
the dielectric mirror is reflective for the first radiation.

8. The radiation-emitting device as claimed in claim 1, wherein
the conversion element is arranged at a distance from the component, such that during operation first radiation from the component firstly traverses a distance through air before it impinges on the conversion element.

9. The radiation-emitting device as claimed in claim 1, wherein
the conversion element is arranged indirectly or directly on the component.

10. The radiation-emitting device as claimed in claim 1, further comprising
a second optoelectronic component for emitting third electromagnetic radiation, wherein
the radiation-emitting device is configured such that third radiation emitted by the second component during operation penetrates into the conversion element via the exit surface of the conversion element,
the conversion element is configured for converting the third radiation,
the dielectric mirror is transmissive to the third radiation.

11. The radiation-emitting device as claimed in claim 10, wherein
an antireflection coating for the third radiation is applied on the exit surface.

12. A projector comprising a radiation-emitting device as claimed in claim 1.

13. A radiation-emitting device, comprising:
a first optoelectronic component for emitting first electromagnetic radiation;
a conversion element having an entrance surface and an exit surface;
a dielectric mirror on the exit surface, wherein
the radiation-emitting device is configured such that first radiation emitted by the component during operation enters the conversion element via the entrance surface,
the conversion element is configured for converting the first radiation into second electromagnetic radiation, which subsequently exits the conversion element via the exit surface, and
the dielectric mirror is transmissive to second radiation that is incident at angles of incidence in a predefined first angle range, and is reflective for second radiation that is incident at angles of incidence in a predefined second angle range; and
a second optoelectronic component for emitting third electromagnetic radiation, wherein
the radiation-emitting device is configured such that third radiation emitted by the second component during operation penetrates into the conversion element via the exit surface of the conversion element,
the conversion element is configured for converting the third radiation, and
the dielectric mirror is transmissive to the third radiation.

\* \* \* \* \*